(12) United States Patent
Yu

(10) Patent No.: US 7,800,905 B1
(45) Date of Patent: Sep. 21, 2010

(54) FLAT VAPOR CHAMBER APPARATUS AND METHOD FOR TRANSFERRING HEAT BETWEEN INTEGRATED CIRCUITS

(75) Inventor: Zhihai Zack Yu, Petaluma, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/873,217

(22) Filed: Oct. 16, 2007

(51) Int. Cl.
*H05K 7/20* (2006.01)
*F28D 15/00* (2006.01)
*F28F 7/00* (2006.01)

(52) U.S. Cl. ............... 361/700; 165/104.33; 165/80.4; 361/697; 361/698; 361/699

(58) Field of Classification Search ............... 361/700
See application file for complete search history.

(56) References Cited

U.S. PATENT DOCUMENTS

| 5,560,423 | A | * | 10/1996 | Larson et al. | ......... | 165/104.26 |
|---|---|---|---|---|---|---|
| 6,082,443 | A | * | 7/2000 | Yamamoto et al. | ..... | 165/104.26 |
| 6,263,959 | B1 | * | 7/2001 | Ikeda et al. | ............ | 165/104.26 |
| 6,317,322 | B1 | * | 11/2001 | Ueki et al. | .................. | 361/700 |
| 6,681,487 | B2 | * | 1/2004 | Sagal et al. | ............ | 29/890.032 |
| 6,827,134 | B1 | * | 12/2004 | Rightley et al. | ......... | 165/104.26 |
| 6,880,624 | B1 | * | 4/2005 | Pinneo | .................. | 165/104.21 |
| 6,885,039 | B2 | * | 4/2005 | Kuwatsuka | ................. | 257/186 |
| 7,019,973 | B2 | * | 3/2006 | Rivera | ......................... | 361/700 |
| 7,405,937 | B1 | * | 7/2008 | Wang et al. | ................. | 361/700 |
| 2004/0240184 | A1 | * | 12/2004 | Rivera | ......................... | 361/720 |
| 2004/0257768 | A1 | * | 12/2004 | Ohmi et al. | ................. | 361/700 |
| 2005/0284615 | A1 | * | 12/2005 | Parish et al. | ........... | 165/104.26 |
| 2006/0096740 | A1 | * | 5/2006 | Zheng | ................... | 165/104.26 |

* cited by examiner

*Primary Examiner*—Gregory D Thompson
(74) *Attorney, Agent, or Firm*—Zilka-Kotab, PC

(57) ABSTRACT

A flat vapor chamber apparatus and method are provided for transferring heat between integrated circuits. In use, a flat vapor chamber is provided with a first end in thermal communication with a first integrated circuit and a second end in thermal communication with a second integrated circuit.

18 Claims, 5 Drawing Sheets

FLAT VAPOR CHAMBER APPARATUS AND METHOD FOR TRANSFERRING HEAT BETWEEN INTEGRATED CIRCUITS

FIELD OF THE INVENTION

The present invention relates to heat exchangers, and more particularly to heat exchangers for use with integrated circuits.

BACKGROUND

Heat exchangers come in a variety of forms such as fans, heat sinks, heat pipes, etc. In the case of heat pipes, such heat transfer mediums are typically used to transfer heat between integrated circuits on a circuit board (e.g. between a northbridge and southbridge circuit, etc.). In some cases, heat pipes with a round cross-section are flattened for such purpose.

Since flattening such round heat pipes typically results in a width insufficient to provide adequate heat transfer, etc., two heat pipes are often used in a side-by-side relationship. However, such technique only provides a limited surface area to contact a corresponding integrated circuit package or heat exchanger. Additionally, using two heat pipes in a side-by-side relationship is often an inefficient use of space on the circuit board.

There is thus a need for addressing these and/or other issues associated with the prior art.

SUMMARY

A flat vapor chamber apparatus and method are provided for transferring heat between integrated circuits. In use, a flat vapor chamber is provided with a first end in thermal communication with a first integrated circuit and a second end in thermal communication with a second integrated circuit.

DETAILED DESCRIPTION

Figure 1:
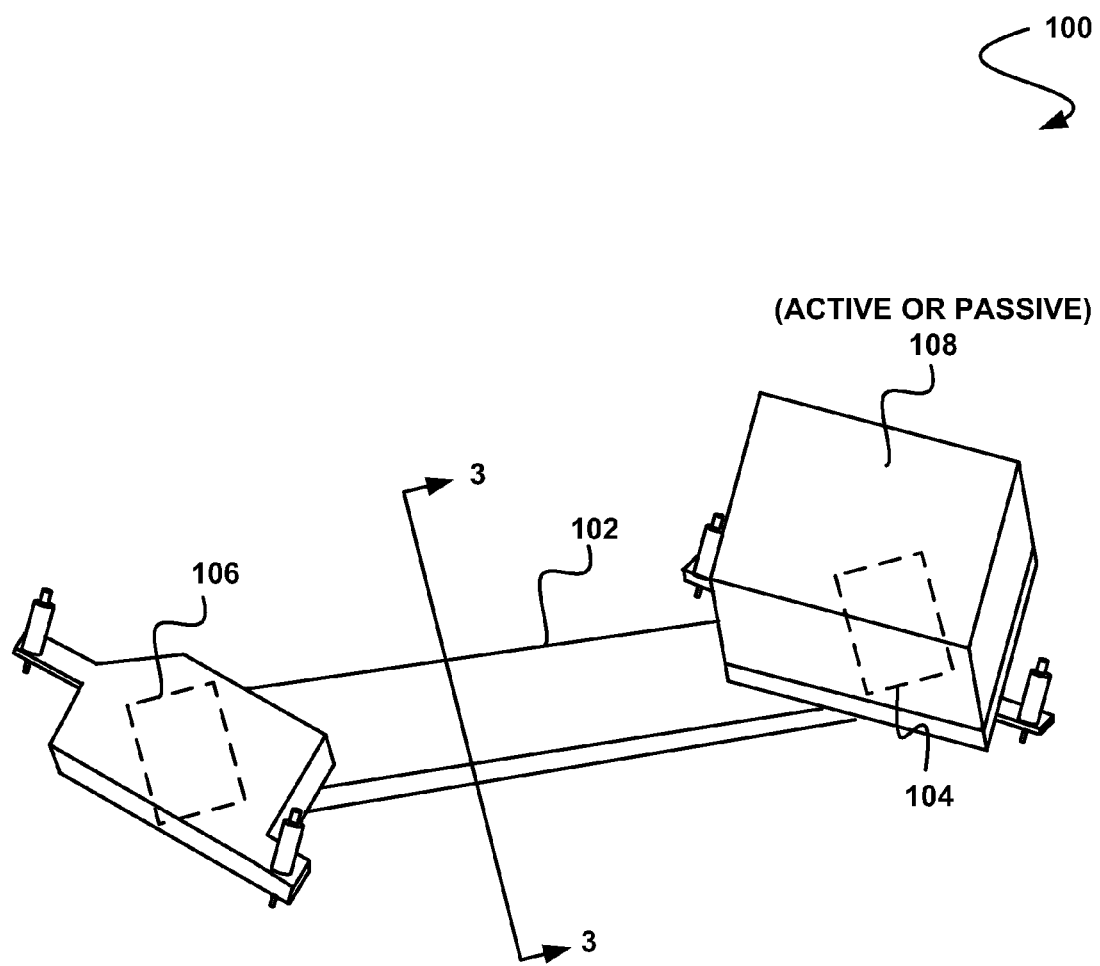
FIG. 1 shows a flat vapor chamber apparatus for transferring heat between integrated circuits, in accordance with one embodiment.

FIG. 1 shows a flat vapor chamber apparatus 100 for transferring heat between integrated circuits, in accordance with one embodiment. As shown, a flat vapor chamber 102 is provided with a first end in thermal communication with a first integrated circuit 104 and a second end in thermal communication with a second integrated circuit 106.

In the context of the present description, a vapor chamber refers to any chamber capable of transporting or transferring heat. For example, in various embodiments, a vapor chamber may include, but is not limited to, a sealed hollow vessel for heat transfer, a sealed square or rectangular pipe, and/or any other chamber that meets the above definition. Furthermore, in the context of the present description, the thermal communication refers to the ability to transfer heat from one object to another object.

Still yet, the term flat vapor chamber refers to a vapor chamber (as defined above) that is originally manufactured to take on a flattened configuration. In other words, the flat vapor chamber is initially formed in a flattened configuration, without necessarily requiring any post-sale flattening. By using a vapor chamber which takes on such an initial-state flat configuration, a device may possibly be provided with a lower profile and a more effective heat transfer capability.

It should be noted that the flat vapor chamber 102 may include any type of material capable of transporting or transferring heat. For example, the flat vapor chamber 102 may include a thermoconductive material such as aluminum or copper. Strictly as an option, the flat vapor chamber 102 may contain a relatively small quantity of fluid or coolant (e.g. water, ethanol, mercury, etc.).

As an additional option, the flat vapor chamber 102 may be comprised of copper sheet metal. In this case, the copper sheet metal may be bonded together to form the flat vapor chamber 102. In one embodiment, the flat vapor chamber 102 may be generated from a mold.

In one embodiment, a casting may be formed about the flat vapor chamber 102. In the context of the present description, a casting refers to any material used to cover the vapor chamber 102, at least in part. As an option, the casting may include an aluminum material.

Furthermore, in one embodiment, the casting may take the form of a fin or a plurality of fins. As an option, the casting may serve as a heat sink. In this case, the casting may be utilized to dissipate heat from the first integrated circuit 104 and/or the second integrated circuit 106.

In one embodiment, the casting may form a channel in which the vapor chamber 102 may be positioned. In the case of multiple vapor chambers, multiple channels may be present for positioning the multiple vapor chambers. In another embodiment, the casting may be configured around the vapor chamber 102.

Additionally, the first integrated circuit 104 and the second integrated circuit 106 may each include any type of integrated circuit. In one embodiment, the first integrated circuit 104 and/or the second integrated circuit 106 may include a northbridge circuit or a southbridge circuit. For example, the first integrated circuit 104 may include a northbridge circuit and the second integrated circuit 106 may include a southbridge circuit.

In the context of the present description, the northbridge circuit may include any circuit that handles data transactions between a central processing unit, a graphics processor, and the southbridge circuit. Further, the southbridge circuit may include any circuit that manages onboard devices such as an integrated development environment (IDE) bus and a peripheral component interconnect (PCI) bus (not shown). While the northbridge and southbridge circuits are disclosed herein, it should be noted that other chipsets are contemplated that communicate with the central processing unit and controls interaction with any memory.

In one embodiment, a heat exchanger may be coupled to the first integrated circuit 104 and/or the second integrated circuit 106. For example, FIG. 1 shows a heat exchanger 108 coupled to the first integrated circuit 104. As an option, the heat exchanger 108 may be an active heat exchanger.

In this case, the heat exchanger 108 may include a fan and/or a liquid-cooled system. In another embodiment, the heat exchanger 108 may be a passive heat exchanger. As an option, such passive heat exchanger may include a heat sink.

In still another embodiment, the apparatus 100 may further include a second heat exchanger (not shown) coupled to the second integrated circuit 106. In this case, the first and the second heat exchanger may include a passive and/or an active heat exchanger. In various embodiments, the first and second heat exchangers may include a fan, a liquid cooling system, a heat sink, and/or any other component used with heat exchangers. For example, in one embodiment, the first heat exchanger may include a fan and the second heat exchanger may include a heat sink.

Figure 2:
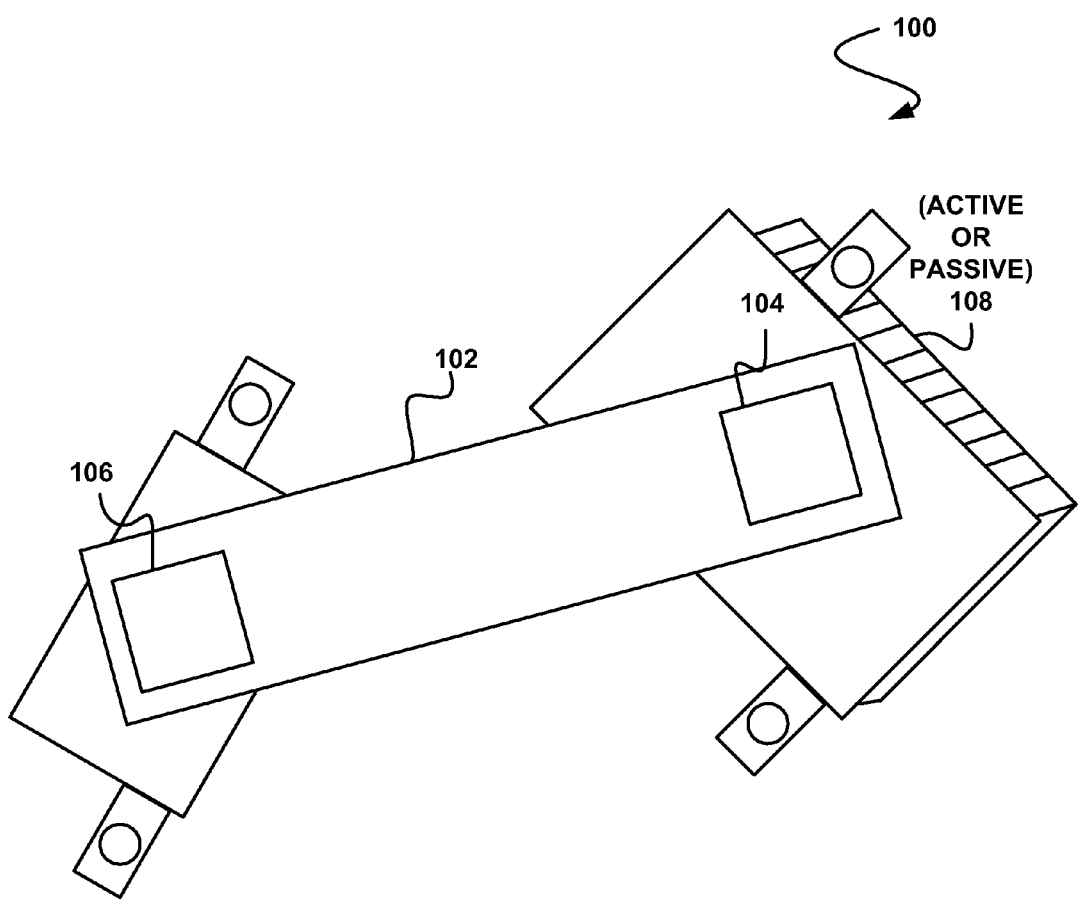
FIG. 2 shows a bottom view of the flat vapor chamber apparatus of FIG. 1, in accordance with one embodiment.

FIG. 2 shows a bottom view of the flat vapor chamber apparatus 100 of FIG. 1, in accordance with one embodiment. As shown, the first end of the flat vapor chamber 102 is in thermal communication with the first integrated circuit 104 and the second end of the flat vapor chamber 102 is in thermal communication with the second integrated circuit 106. As an option, the flat vapor chamber 102 may remain in direct contact with the first integrated circuit 104 and/or the second integrated circuit 106.

By remaining in direct contact with the first integrated circuit 104 and/or the second integrated circuit 106, a maximum amount of surface area of the flat vapor chamber 102 may be exposed to the integrated circuits, thereby maximizing the potential heat transfer between the integrated circuits and the flat vapor chamber 102. Furthermore, by utilizing a flat configuration for the vapor chamber 102 a surface area of the vapor chamber 102 which is exposed to the associated integrated circuit may be maximized. This may allow for a more efficient transfer of heat from the first integrated circuit 104 and/or the second integrated circuit 106.

In one embodiment, a block (not shown) may be positioned between the vapor chamber 102, and the first integrated circuit 104 or the second integrated circuit 106. As an option, the block may include a copper material. In this case, the first integrated circuit 104 and/or the second integrated circuit 106 may transfer heat to the vapor chamber 102 through the block.

It should, be noted that the length and width of the flat vapor chamber 102 may vary in different embodiments. In one embodiment, the width of the flat vapor chamber 102 may depend on the first integrated circuit 104 and/or the second integrated circuit 106. In this case, various characteristics of the integrated circuits 104 and 106 may contribute to the determination of the width of the flat vapor chamber 102.

For example, in various embodiments, such characteristics of the integrated circuits 104 and 106 may include, but are not limited to a size, a type, an operating temperature, a power consumption, a particular use, and/or various other characteristics of the integrated circuits 104 and 106. In one embodiment, the integrated circuits 104 and 106 may be such that a relatively wide vapor chamber may increase the efficiency of heat transfer. For example, a width of the of the flat vapor chamber 102 may be such that an entire upper surface of the integrated circuits 104, 106 may remain in direct contact with a corresponding surface of the flat vapor chamber 102.

In still another embodiment, a system configuration may determine the length and width of the flat vapor chamber 102. For example, a system in which the vapor chamber apparatus 100 is utilized may determine the maximum allowable width and/or length of the flat vapor chamber 102. It should be noted that increasing the width of the flat vapor chamber 102 also may increase the surface area which is exposed to the air, as well as the surface area in contact with the integrated circuits 104 and 106. Thus, in certain situations, it may be desired to maximize the width of the flat vapor chamber 102. In one embodiment, the flat vapor chamber 102 itself may have a width of 10 mm, 15 mm, 20 mm, 25 mm or more.

Additionally, in one embodiment, a casting may contribute to the width of the flat vapor chamber 102. For example, the flat vapor chamber 102 may have a width of 8 to 10 mm, and with the casting, the total width may be 25 mm. Thus, in one embodiment, the casting may be configured to maximize a surface area in contact with the integrated circuits 104 and 106. It should be noted that the width of the casting may vary depending on the system configuration, the integrated circuits 104 and 106, and/or the flat vapor chamber 102.

Figure 3:
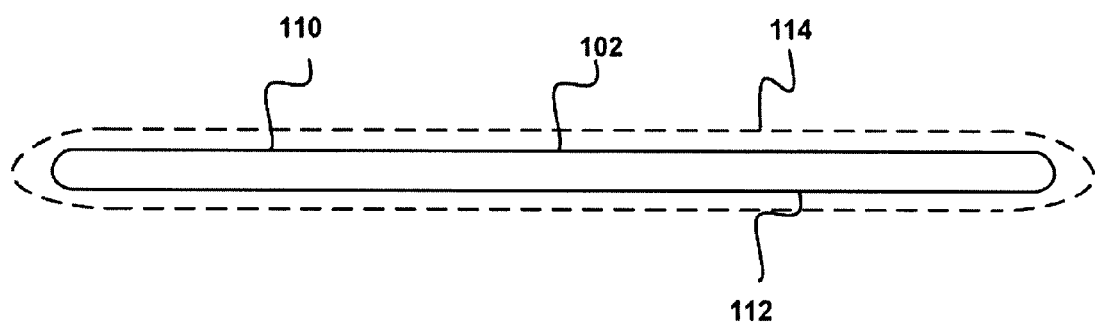
FIG. 3 is a cross-sectional view of the flat vapor chamber of FIG. 1 taken along line 3-3 of FIG. 1, in accordance with one embodiment.

FIG. 3 is a cross-sectional view of the flat vapor chamber 102 of FIG. 1 taken along line 3-3 of FIG. 1, in accordance with one embodiment. As shown, the flat vapor chamber 102 is configured such that an upper surface 110 and a lower surface 112 of the flat vapor chamber 102 are planar. Using this configuration, a contact area between an integrated circuit and the flat vapor chamber 102 may be maximized.

For example, if the lower surface 112 of the flat vapor chamber 102 had a curved surface, as opposed to a planar surface, less surface area of the flat vapor chamber 102 would be in contact with objects (e.g. integrated circuits with a planar top surface) coupled to, or in contact with, the lower surface 112 of the flat vapor chamber 102. It should be noted that, although the flat vapor chamber 102 is illustrated as entirely planar, other configurations are contemplated with less planarity. For example, in various embodiments, a percentage of an entire width of the flat vapor chamber 102 that is planar may exceed 50%, 60%, 70%, 80%, 90%, 95%, 99%, etc.

As an option, the flat vapor chamber 102 may be covered with a casting 114. In various embodiments, the casting 114 may be positioned just about the upper surface 110 of the flat vapor chamber 102, just about the lower surface 112, or about both as desired. In one embodiment, the casting 114 may include fins. The fins may be used to dissipate heat from the flat vapor chamber 102, for example. In such embodiment, the flat vapor chamber 102 may function as a heat sink. It should be noted that the thickness of the casting 114 may vary depending on particular characteristics of a system in which the flat vapor chamber 102 with the casting 114 is incorporated. In one embodiment, the thickness of the casting 114 may be based a required profile.

Figure 4:
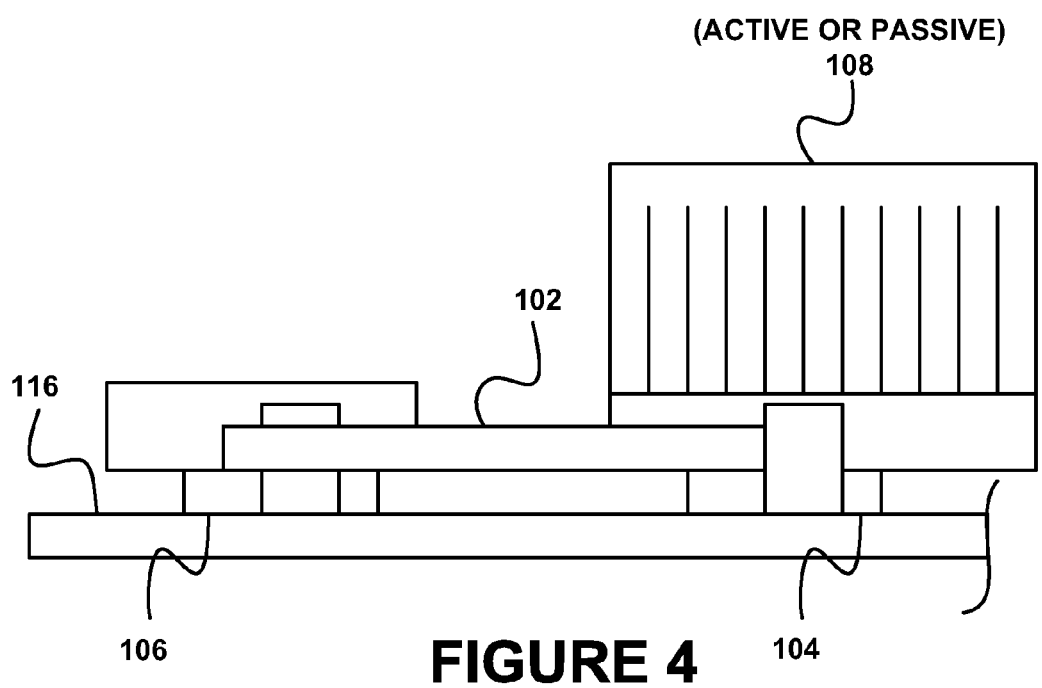
FIG. 4 shows a side view of the flat vapor chamber apparatus of FIG. 1 during use, in accordance with one embodiment.

FIG. 4 shows a side view of the flat vapor chamber apparatus 100 of FIG. 1 during use, in accordance with one embodiment. As shown, the first integrated circuit 104 and the second integrated circuit 106 are in contact with the flat vapor chamber 102. As a result, the first integrated circuit 104 and the second integrated circuit 106 are in thermal communication.

As shown further, the first integrated circuit 104 may be coupled to the heat exchanger 108. Of course, this is strictly an option, as the first integrated circuit 104 may be utilized without the heat exchanger 108 in other embodiments. Similarly, in one embodiment, the second integrated circuit 106 may be coupled to a heat exchanger.

Furthermore, the heat exchanger 108 may represent a variety of heat exchangers. For example, in various embodiments, the heat exchanger 108 may represent an active heat exchanger (e.g. a fan system, liquid cooling system, etc.), a passive system (e.g. heat sinks, etc.), and/or a combination of the same.

As an option, and as shown in FIG. 4, the first integrated circuit 104 and the second integrated circuit 106 may be mounted on a circuit board 116. In one embodiment, the circuit board 116 may include a mother board. The mounting of the first integrated circuit 104 and the second integrated circuit 106 may vary depending on the integrated circuits 104, 106. For example, in one embodiment, the first integrated circuit 104 and/or the second integrated circuit 106 may be a flip chip component.

In the context of the present description, a flip chip refers to any electronic component or semiconductor device that may be mounted directly onto a substrate, circuit board, or carrier without the use of wirebonds. In another embodiment, the first integrated circuit 104 and/or the second integrated circuit 106 may be wirebounded to the circuit board 116.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 5:
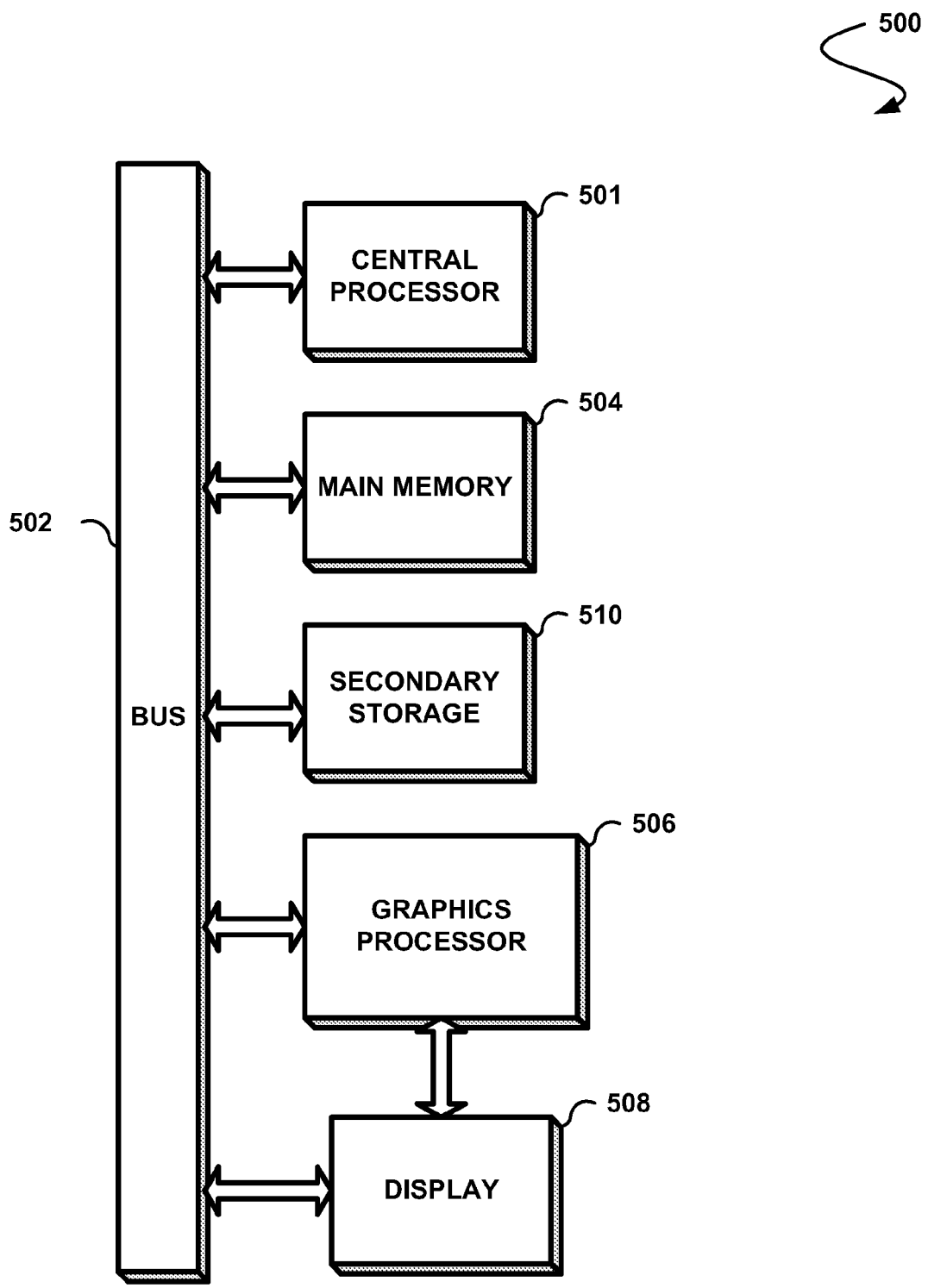
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one host processor 501 which is connected to a communication bus 502. The system 500 also includes a main memory 504. Control logic (software) and data are stored in the main memory 504 which may take the form of random access memory (RAM).

The system 500 also includes a graphics processor 506 and a display 508, i.e. a computer monitor. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, an integrated circuit (not shown) that is capable of at least a portion of the capabilities of both the host processor 501 and the graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, lap-top computer, and/or any other type of logic. Still yet, the system 500 may take the form of various other devices in including, but not limited to a personal digital assistant (PDA) device, a mobile phone device, a television, etc.

Further, while not shown, the system 500 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus, comprising:
a flat vapor chamber with a first end in thermal communication with a first integrated circuit and a second end in thermal communication with a second integrated circuit; and
a first heat exchanger coupled to the first integrated circuit and a second heat exchanger coupled to the second integrated circuit;
wherein the first heat exchanger includes a fan and the second heat exchanger includes a heat sink;
wherein the flat vapor chamber includes a sealed hollow pipe and a separate casting is formed about the flat vapor chamber.

2. The apparatus of claim 1, wherein the casting includes an aluminum material.

3. The apparatus of claim 1, wherein the casting takes the form of at least one fin.

4. The apparatus of claim 1, wherein the casting serves as a heat sink.

5. The apparatus of claim 1, wherein at least one of the first integrated circuit and the second integrated circuit includes at least one of a northbridge circuit and a southbridge circuit.

6. The apparatus of claim 1, wherein the first integrated circuit includes a northbridge circuit and the second integrated circuit includes a southbridge circuit.

7. The apparatus of claim 1, wherein the first heat exchanger is an active heat exchanger.

8. The apparatus of claim 7, wherein the active heat exchanger further includes a liquid-cooled system.

9. The apparatus of claim 1, wherein the second heat exchanger is a passive heat exchanger.

10. The apparatus of claim 1, wherein the flat vapor chamber is further in direct contact with at least one of the first integrated circuit and the second integrated circuit.

11. The apparatus of claim 1, wherein the first integrated circuit and the second integrated circuit are mounted on a mother board.

12. The apparatus of claim 1, wherein the flat vapor chamber has a width of at least 10 mm.

13. The apparatus of claim 1, wherein the casting is formed and positioned just about an upper surface of the flat vapor chamber covering the upper surface of the flat vapor chamber.

14. The apparatus of claim 1, wherein the separate casting forms a channel in which the flat vapor chamber is positioned.

15. The apparatus of claim 1, wherein the flat vapor chamber is covered with the separate casting.

16. A method, comprising:

providing a flat vapor chamber;

mounting a first end of the flat vapor chamber in thermal communication with a first integrated circuit; and mounting a second end of the flat vapor chamber in thermal communication with a second integrated circuit;

wherein a first heat exchanger is coupled to the first integrated circuit and a second heat exchanger coupled to the second integrated circuit;

wherein the first heat exchanger includes a fan and the second heat exchanger includes a heat sink;

wherein the flat vapor chamber includes a sealed hollow pipe and a separate casting is formed about the flat vapor chamber.

17. A system, comprising:

a circuit board with a first integrated circuit and a second integrated circuit mounted thereon;

a flat vapor chamber with a first end in thermal communication with the first integrated circuit and a second end in thermal communication with the second integrated circuit; and a first heat exchanger coupled to the first integrated circuit and a second heat exchanger coupled to the second integrated circuit;

wherein the first heat exchanger includes a fan and the second heat exchanger includes a heat sink;

wherein the flat vapor chamber includes a sealed hollow pipe and a separate casting is formed about the flat vapor chamber.

18. The system of claim 17, wherein the circuit board is a component of a computer coupled to a display.

* * * * *